Figure 1:
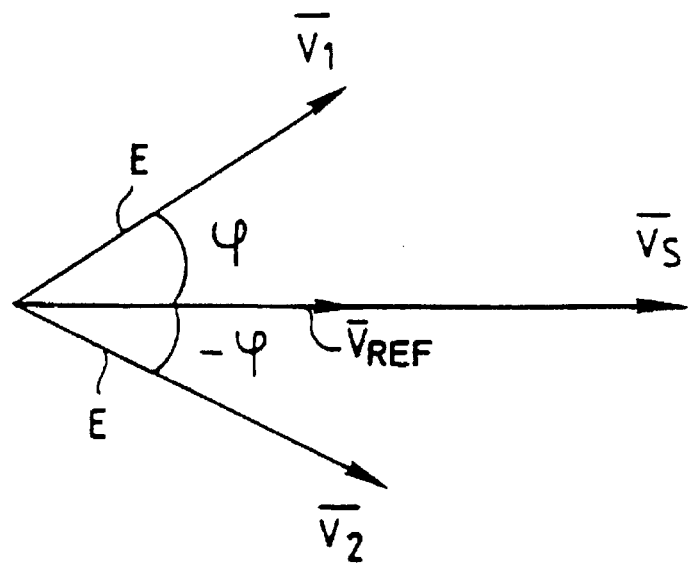

United States Patent [19]

Linguet

[11] Patent Number: 5,659,272
[45] Date of Patent: Aug. 19, 1997

[54] AMPLITUDE MODULATION METHOD AND APPARATUS USING TWO PHASE-MODULATED SIGNALS

[75] Inventor: Laurent Linguet, Clichy, France

[73] Assignee: Thomson-CSF, Paris, France

[21] Appl. No.: 564,263

[22] PCT Filed: Jun. 25, 1993

[86] PCT No.: PCT/FR93/00639

§ 371 Date: Dec. 26, 1995

§ 102(e) Date: Dec. 26, 1995

[87] PCT Pub. No.: WO95/01005

PCT Pub. Date: Jan. 5, 1995

[51] Int. Cl.[6] ............................................. H03C 1/50
[52] U.S. Cl. .................. 332/151; 332/183; 375/268; 375/300; 455/108
[58] Field of Search .................. 332/151, 152, 332/153, 154, 183, 149; 455/108; 375/268, 300, 320

[56] References Cited

U.S. PATENT DOCUMENTS

| | | | |
|---|---|---|---|
| 4,319,204 | 3/1982 | Weldon et al. | 332/113 |
| 4,331,941 | 5/1982 | Kovalick et al. | 332/149 |
| 4,355,289 | 10/1982 | Beyer et al. | 332/105 |
| 5,093,636 | 3/1992 | Higgins, Jr. et al. | 332/151 |

FOREIGN PATENT DOCUMENTS

| | | |
|---|---|---|
| 0 011 464 | 5/1980 | European Pat. Off. . |
| 2 690 794 | 11/1993 | France . |

*Primary Examiner*—Siegfried H. Grimm
*Attorney, Agent, or Firm*—Oblon, Spivak, McClelland, Maier & Neustadt, P.C.

[57] ABSTRACT

A method and apparatus for generating an amplitude-modulated signal based on a modulation signal including first and second digital oscillators which are controlled based on first and second phase shifts derived from the modulation signal, and output first and second phase-modulated signals having a same amplitude and first and second phases, respectively; first and second amplification channels which amplify the first and second phase-modulated signals, respectively, and output first and second amplified phase-modulated signals; an adder which adds the first and second amplified phase-modulated signals and outputs a resultant amplitude-modulated signal; and a filter which filters the resultant amplitude-modulated signal and outputs the amplitude-modulated signal. The method and apparatus for amplitude modulation is suited for applications in "solid state" power transmitters.

6 Claims, 3 Drawing Sheets

AMPLITUDE MODULATION METHOD AND APPARATUS USING TWO PHASE-MODULATED SIGNALS

The present invention relates to a method and a device for amplitude modulation of a signal. It applies particularly to power transmitters known as "solid state" transmitters in the radio frequency field, which are produced on the basis of field-effect or MOSFET-type power transistors.

With the advent of power transistors, which are easy to control and have short switching times making them capable of operating at frequencies from a few hundred kilohertz to one megahertz or more, vacuum-tube transmitters, which are expensive and bulky, requiring very high-voltage power supplies which are difficult to maintain, are tending to be replaced by transmitters the amplifier stages of which use these types of transistors. These transmitters generally consist of elementary power amplifiers or modules assembled in parallel or in series in such a way as to transmit the required power. The usual architecture of these modules is of the H-bridge type, also called "full bridge". Several solutions currently exist for amplitude modulation of the output signal from these transmitters. One is described by the patent application No. 2,567,338 and entitled "Amplifier with amplification stages switchable as a function of the amplitude of the signal to be amplified", filed in France in the name of the Applicant.

This solution is relatively simple to implement and requires no particular management of the operation of the elementary modules. Nevertheless, it requires many chokes and capacitors, dimensioned for sizeable voltages and circuits, as well as transformers with many secondaries, and is therefore an expensive and bulky solution of mediocre efficiency.

Another solution comprising digital management of the modules allows an enhancement of the efficiency but at the cost of great complexity in management of the modules. In this case, the envelope of the transmitted wave is constructed by superposition of the signal supplied by each of the power modules fed with the same voltage E and the operation of which is controlled by the digital part. However, in order to refine the envelope of the signal to be transmitted, it is necessary to use additional power modules fed with a voltage $E/2$, $E/4 \ldots E/2^P$. This constitutes a major drawback since the elementary modules are no longer all identical, and thus denies the complete interchangeability of these modules. Neither does this allow a mode of operation at degraded or reduced power, since placing at least one module out of circuit, following any malfunction, entails distortion of the transmitted wave in contrast to a solution consisting of interchangeable modules the stopping of one or the other of which entails only a reduction in the transmitted power, while, fairly often in certain particular circumstances, such an operating mode may remain satisfactory for the application.

Moreover, this solution requires many different voltage sources, and the continual switching of the modules generates interfering stray signals. It should be noted, moreover, that the absence of complete interchangeability of the modules entails additional difficulty and cost of maintenance and development.

The object of the invention is to alleviate the abovementioned drawbacks.

To this end, the subject of the invention is a method of amplitude modulation of a signal by a modulation signal characterized in that it consists in breaking down the signal to be modulated into a first and a second signal of the same amplitude and of opposite phases, in phase modulating the first and second signal by the modulation signal and in adding the first and second phase-modulated signals in order to obtain a resultant amplitude-modulated signal.

A further subject of the invention is a device for implementing the abovementioned method.

The main advantages of the invention are that it allows great flexibility in the control of the output power, better precision in the amplitude of the output signal as a function of the modulation signal at the input of the transmitter, and very good overall efficiency. It moreover allows easy maintenance and a degraded-power operating mode.

Other characteristics and advantages of the invention will emerge with the aid of the description which follows, given with regard to the attached drawings which represent:

FIG. 1, a vectorial diagram for illustrating the modulation method implemented by the invention.

Figure 2:
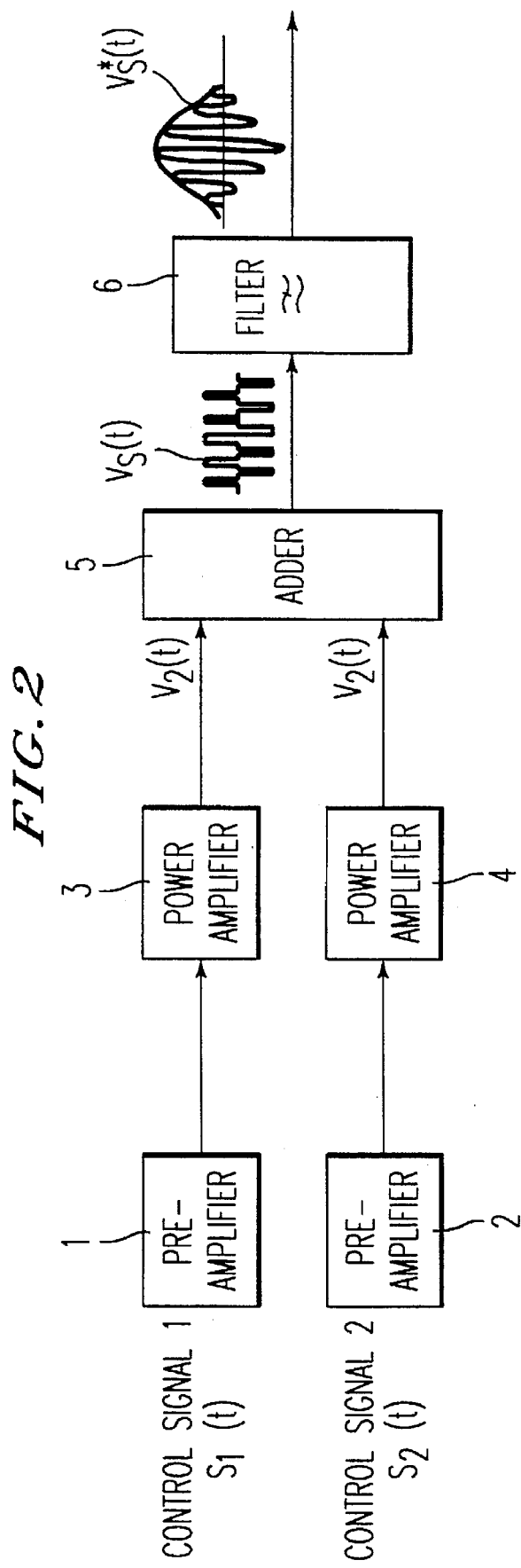

FIG. 2, an embodiment of a device for implementing the modulation method according to the invention.

Figure 3:
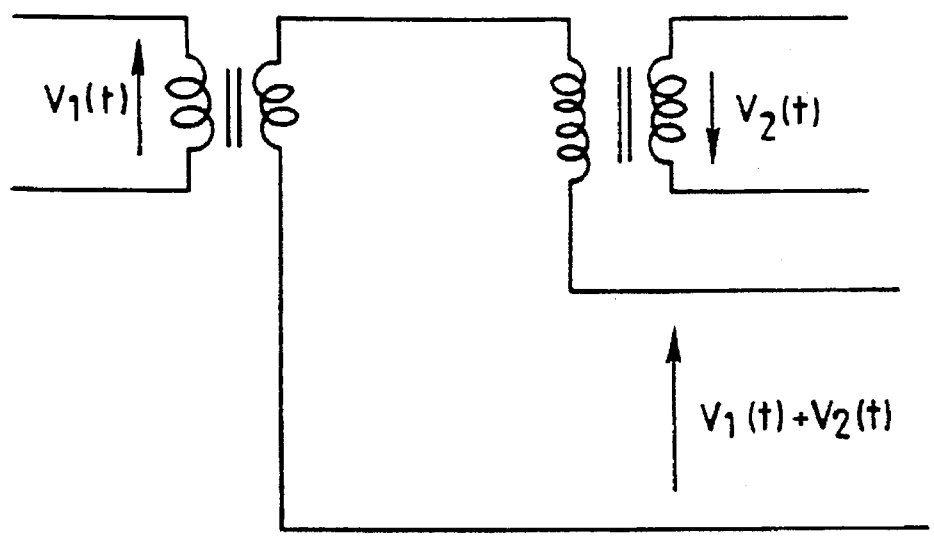

FIG. 3, an embodiment of an adder circuit for implementing the device of FIG. 2.

Figure 4:
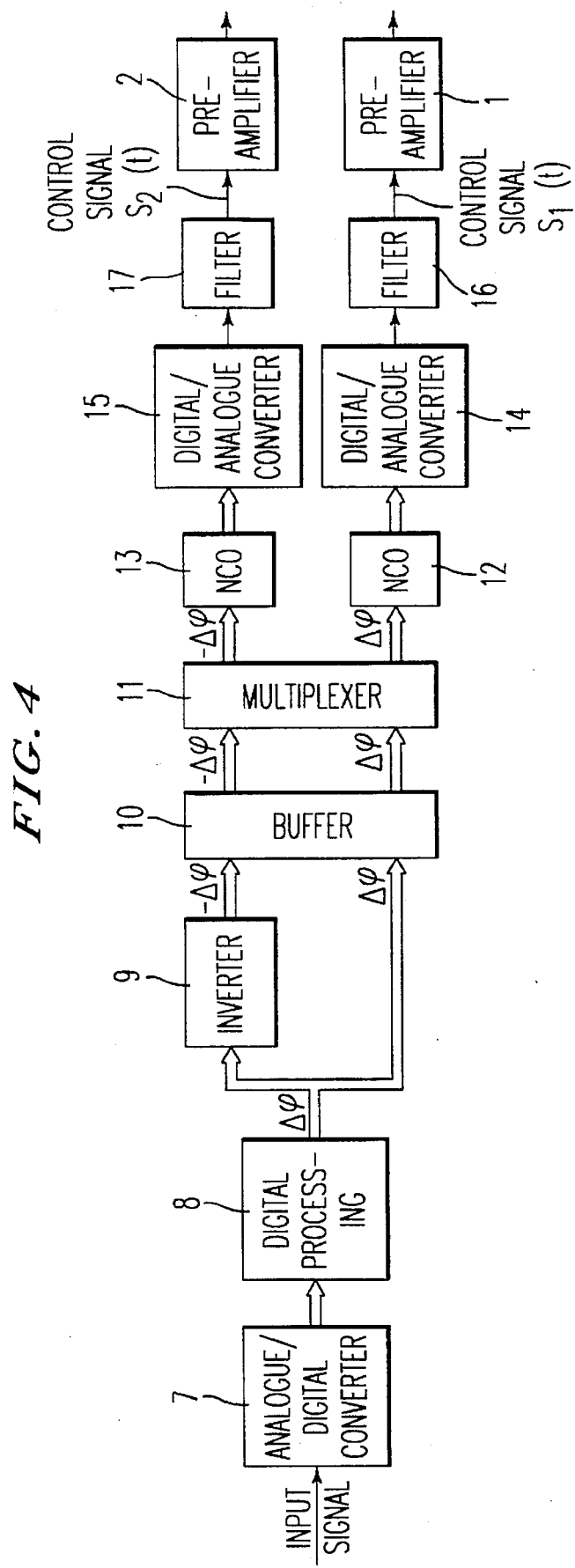

FIG. 4, an embodiment of a control device of the embodiment of FIG. 2.

FIG. 1 illustrates the basic principle of the invention. In this figure, the vectors $\overline{V}_1$ and $\overline{V}_2$ constitute the vector representation according to the Fresnel method of two sinusoidal signals of constant frequencies, phase shifted respectively, with respect to a reference signal $\overline{V}_{REF}$ of the same frequency, by an angle and by an angle –. Considering the case in which these two signals have the same amplitude E and where their frequency is equal to f, the time function of the signal associated with the vector $\overline{V}_1$ can be written $$V_1(t)=E \cos\ ([2\pi f]t+) \quad (1)$$

and the time function of the signal associated with the vector $\overline{V}_2$ can be written $$V_2(t)=E \cos\ ([2\pi f]t-) \quad (2)$$

where t represents time the abovementioned phase-shift angle and

E the amplitude of the vectors $\overline{V}_1$ and $\overline{V}_2$

The sum signal of these two signals $V_1(t)+V_2(t)$ is associated with the vector $\overline{V}_s$ of FIG. 1, vector sum of $\overline{V}_1$ and $\overline{V}_2$, and its maximum amplitude is 2 E cos. It keeps the same frequency f.

From this result, the method according to the invention consists in using elementary power modules each consisting of two amplifiers delivering output signals of the same frequency, equal to the transmission frequency, and of the same predefined amplitude but phase shifted, one by an angle, the other by an angle – with respect to a reference signal, then in summing these two signals. According to the abovementioned result, a signal results therefrom with a frequency equal to the transmission frequency and with an amplitude which is a sinusoidal function of the abovementioned phase-shift angle. Amplitude modulation of the output signal from the elementary module can thus be achieved by acting on the phase shift angle.

A device for implementing this method is represented in FIG. 2. This device includes a first and a second amplification channel consisting respectively of a first preamplifier 1 coupled to a first power amplifier 3 and of a second preamplifier 2 coupled to a second power amplifier 4. The respective outputs of the power amplifiers 3 and 4 are coupled respectively to a first and a second input of a voltage adder circuit 5. The output of the adder circuit 5 is coupled to the input of a filter 6.

In this description, the signals $V_1(t)$ and $V_2(t)$ described previously by the relations (1) and (2) are added by the adder circuit 5 to give the resultant signal $V_s(t)$ associated with the vector $\overline{V}_s$ of FIG. 1. An embodiment of a corresponding adder circuit is shown in FIG. 3. This circuit includes two transformers, with transformer ratio equal to 1, for example, and the primaries of which are linked respectively to the outputs of the amplifiers 3 and 4 and thus have the signals $V_1(t)$ and $V_2(t)$ at their terminals, their secondaries are wired in series, which makes it possible, at the terminals of this series assembly, to obtain the sum $V_1(t)+V_2(t)=V_s(t)$.

At this point in the description it is worth making the following comment: the vector summation carried out according to the principle of FIG. 1 applies only to sinusoidal signals of the same frequency, whereas, in the invention, the sum produced by the adder 5 may, for example, apply to signals of the same frequency but square. Nevertheless, the result remains valid for the output voltage $V_s^*(t)$ of the filter 6, by virtue of the superposition principle. This is because the abovementioned square signals are the sum of an infinite series of sinusoidal or harmonic signals, whose harmonics of the same frequency can be added. For each of these sums, the amplitude of the resultant signal is actually a sinusoidal function of the abovementioned phase shift angle , thus, in particular, this is satisfied for the main harmonic or fundamental remaining at the output of the filter 6. Thus if E is the defined amplitude of the output signals $V_1(t)$ and $V_2(t)$ from the power amplifiers 3 and 4, and $V_s(t)$ the output signal from the elementary module, then $V_s=2$ E cos , which is the outcome sought.

The signals $V_1(t)$ and $V_2(t)$ at the output of the amplifiers 3 and 4 are synchronous with the control signals $s_1(t)$ and $s_2(t)$ at the input of the pre-amplifiers 1 and 2. These two signals are phase modulated, and they can be derived in the way represented in FIG. 4. The purpose of this control device is to supply a phase-shift angle as has already been described, as a function of a datum value or of a modulation signal applied to its input. This modulation signal is converted digitally by the analog-digital converter 7. The conversion frequency is equal to the transmission frequency, for example, or to one of its multiple frequencies. The digital processing circuit 8 receives the data item leaving the analog-digital converter and carries out an operation the result of which corresponds to the value of the phase shift to be produced on the control signals for the switches or transistors of the power amplifiers 3 and 4. That is to say, in fact, if $A_m$ corresponds to the maximum amplitude of the modulating signal and B the amplitude of the modulating signal at the instant of analog-digital conversion, the corresponding phase shift is given by the equation:

$$=\text{arc cos } B/A_m$$

Having stored the previous phase shift angle in memory, the digital processing circuit 8 calculates the variation in the phase shift to be applied to the control signal. To this end, the digital processing circuit 8 may, for example, be produced from memories including programmable logic circuits and tables.

The inverter 9 changes the sign of the digitized phase-shift variation output by the digital processing circuit 8 so as to obtain a symmetric phase variation $-\Delta$. The two data items $\Delta$ and $-\Delta$ are presented to the input of a buffer circuit 10 in order to be synchronized before being multiplexed by a multiplexer 11. The data items $\Delta$ and $-\Delta$ always present at the output of the multiplexer 11 are acted upon by digital oscillators 12 and 13 known by the abbreviation NCO for "Numerically Controlled Oscillator". The circuits used may, for example, be circuits with the reference STEL-1175 marketed by the STANFORD company registered in the United States of America. These NCO circuits each generate a periodic digital signal varying sinusoidally at the transmission frequency of the signal to be modulated, the phase of which varies according to the phase data item present at their inputs, therefore following the phase variation $\Delta$ or $-\Delta$ calculated by the digital processing circuit. The output signal of each NCO 12 and 13 is converted into analog by a digital-analog converter 14 and 15. The signals at the output of the converters 14 and 15 are filtered through filters 16 and 17. This results in two sinusoidal signals at the transmission frequency $s_1(t)$ and $s_2(t)$, one phase shifted by an angle , the other phase shifted by an angle − with respect to a reference signal, being a function of the modulation signal at the input of the control device. These two control signals, amplified and shaped by the preamplifiers 1 and 2, are applied to the respective inputs of the two power amplifiers 3 and 4, as has previously been explained.

The multiplexer 11 serves to select either the modulation data item ($\Delta$, $-\Delta$) or the frequency data item, the latter, not represented in the block diagram of FIG. 4, serves to initialize the start-up frequency.

From the description of an elementary module and the description of a control device, it is apparent that the symmetric phase shifts produced on the output signals from the power amplifiers 3 and 4 correspond to the phase shifts produced in terms of the signals $s_1(t)$ and $s_2(t)$ output from the control, these phase shifts themselves being a function of the modulation signal at the input of the control device. With the amplitude of the output signal from a module being a function of these phase shifts, it will therefore be a function of this modulation signal, which is exactly the outcome sought. The type of modulating signal may correspond to all magnitudes whenever it can be converted into a phase-shift angle. Moreover, as all the elementary modules of the transmitter are identical, they can be controlled by the same control device. In practice, for reasons of convenience and development, several control cards shared by groups of elementary modules could be defined.

The power required at the output of the transmitter will dictate the number of elementary modules. These could, for example, be assembled in parallel or in series. Circuits for balancing currents or voltages could, for example, be added, as well as short-circuit protection.

One possible variant of the embodiment of an elementary module consists in using four power amplifiers instead of two, the output signals from which each have the phase shifts $_1$, $-_1$, $_2$ and $-_2$ respectively with respect to a reference signal, $_1$ playing the part of the phase-shift angle described in the present invention, $_2$ serving to reduce any possible distortion of the output signal. It can be envisaged, moreover, to increase the number of power amplifiers per elementary module, which can only enhance the quality of the output signal; nevertheless, their number may be limited for reasons of feasibility and of cost.

I claim:

1. A method of generating an amplitude-modulated signal based on a modulation signal, comprising the steps of:

controlling first and second digital oscillators based on first and second phase shifts derived from the modulation signal, to obtain first and second phase-modulated signals having a same amplitude and first and second phases, respectively;

amplifying the first and second phase-modulated signals with first and second amplification channels, respectively, to obtain first and second amplified phase-modulated signals;

adding the first and second amplified phase-modulated signals to obtain a resultant amplitude-modulated signal; and filtering the resultant amplitude-modulated signal to obtain the amplitude-modulated signal.

2. The method according to claim 1, wherein the step of controlling further comprises the steps of:

digitally processing the modulation signal with a digital processing circuit to control the first and second phases of the first and second phase-modulated signals, respectively, output by the first and second digital oscillators as a function of an amplitude of the modulation signal.

3. The method according to claim 2, further comprising the steps of:

storing in a memory of the digital processing circuit the first and second phase shifts for the first and second digital oscillators, respectively, the first and second phase shifts used to determine the first and second phases of the first and second phase-modulated signals, respectively;

synchronizing the first and second phase shifts with a synchronization buffer circuit to obtain synchronized first and second phase shifts; and multiplexing the synchronized first and second phase shifts to the first and second digital oscillators, respectively.

4. A device for generating an amplitude-modulated signal based on a modulation signal, comprising:

first and second digital oscillators which are controlled based on first and second phase shifts derived from the modulation signal, and output first and second phase-modulated signals having a same amplitude and first and second phases, respectively;

first and second amplification channels which amplify the first and second phase-modulated signals, respectively, and output first and second amplified phase-modulated signals;

an adder which adds the first and second amplified phase-modulated signals and outputs a resultant amplitude-modulated signal; and a filter which filters the resultant amplitude-modulated signal and outputs the amplitude-modulated signal.

5. The device according to claim 4, further comprising:

a digital processor which receives the modulation signal and digitally processes the modulation signal to control the first and second phases of the first and second phase-modulated signals, respectively, as a function of the amplitude of the modulation signal.

6. The device according to claim 5, further comprising:

the digital processor comprising a memory which stores first and second phase shifts for the first and second digital oscillators, respectively, the first and second phase shifts used to determine the first and second phases of the first and second phase-modulated signals, respectively;

a synchronization buffer connected to the digital processor and which synchronizes the first and second phase shifts and outputs first and second synchronized phase shifts; and a multiplexer connected to the synchronization buffer and which multiplexes the first and second synchronized phase shifts to the first and second digital oscillators, respectively.

* * * * *